(12) United States Patent
Rajasekhar et al.

(10) Patent No.: US 10,715,160 B1
(45) Date of Patent: Jul. 14, 2020

(54) LOW NOISE ANALOG-TO-DIGITAL CONVERTER

(71) Applicant: Analog Devices International Unlimited Company, Limerick (IE)

(72) Inventors: Sanjay Rajasekhar, Newbury (GB); Jesper Steensgaard-Madsen, Sequim, WA (US); Hongxing Li, Andover, MA (US); Christopher Peter Hurrell, Cookham (GB)

(73) Assignee: Analog Devices International Unlimited Company, Limerick (IE)

( * ) Notice: Subject to any disclaimer, the term of this patent is extended or adjusted under 35 U.S.C. 154(b) by 0 days.

(21) Appl. No.: 16/570,433

(22) Filed: Sep. 13, 2019

(51) Int. Cl.
| | | |
|---|---|---|
| *H03M 1/06* | (2006.01) | |
| *H03M 1/00* | (2006.01) | |
| *H03M 1/10* | (2006.01) | |
| *H03M 1/12* | (2006.01) | |

(52) U.S. Cl.
CPC .......... *H03M 1/0626* (2013.01); *H03M 1/001* (2013.01); *H03M 1/06* (2013.01); *H03M 1/1009* (2013.01); *H03M 1/12* (2013.01)

(58) Field of Classification Search
CPC ........ H03M 1/06; H03M 1/12; H03M 1/1009; H03M 1/001
USPC ................................ 341/118, 155, 120, 110
See application file for complete search history.

(56) References Cited

U.S. PATENT DOCUMENTS

| | | | |
|---|---|---|---|
| 5,047,665 A | 9/1991 | Burt | |
| 5,272,481 A | 12/1993 | Sauer | |
| 5,406,283 A | 4/1995 | Leung | |
| 5,754,131 A * | 5/1998 | Ribner | H03M 3/32 341/118 |
| 6,342,919 B2 | 1/2002 | Opris | |
| 6,865,230 B1 | 3/2005 | Adams et al. | |
| 7,675,452 B2 | 3/2010 | Madhavan et al. | |
| 7,764,215 B2 | 7/2010 | Wan et al. | |
| 7,812,757 B1 | 10/2010 | Wong et al. | |
| 8,040,264 B2 | 10/2011 | Hummerston et al. | |
| 8,508,257 B2 | 8/2013 | Kapusta et al. | |
| 8,581,770 B2 | 11/2013 | Wang et al. | |
| 8,593,317 B2 | 11/2013 | Aras et al. | |

(Continued)

FOREIGN PATENT DOCUMENTS

CN          107809246 A          3/2018

OTHER PUBLICATIONS

Chio, U-Fat, et al., "Design and Experimental Verification of a Power Effective Flash-SAR Subranging ADC", IEEE Transactions on Circuits and Systems—II: Express Briefs, 57(8), (Aug. 2010), 5 pgs.

(Continued)

*Primary Examiner* — Joseph J Lauture
(74) *Attorney, Agent, or Firm* — Schwegman Lundberg & Woessner, P.A.

(57) ABSTRACT

Noise sources in an ADC circuit can include kT/C noise of a sampling capacitor, noise coupling on to sampling capacitors from digital circuits, and amplifier noise. Also, charge injection from mismatch in sample switches can cause offsets. These various noise sources can be largely canceled or reduced using described techniques. As a result, the size of the sampling capacitors can be greatly reduced, while still achieving significantly improved noise performance and power efficiency for the overall converter.

22 Claims, 4 Drawing Sheets

(56) References Cited

U.S. PATENT DOCUMENTS

| | | |
|---|---|---|
| 8,604,962 B1 | 12/2013 | Lewyn |
| 8,659,460 B2 | 2/2014 | Nani et al. |
| 8,700,075 B2 | 4/2014 | Riddle et al. |
| 8,896,476 B2 | 11/2014 | Harpe |
| 9,154,152 B1 | 10/2015 | Chiu et al. |
| 9,391,628 B1 | 7/2016 | Lyden et al. |
| 9,923,569 B1 | 3/2018 | Chen et al. |
| 10,128,859 B1 | 11/2018 | Rajasekhar et al. |
| 10,177,779 B2 | 1/2019 | Lee et al. |
| 10,205,462 B2 | 2/2019 | Shen et al. |
| 2016/0352347 A1 | 12/2016 | Fernando et al. |

OTHER PUBLICATIONS

Devarajan, Siddharth, et al., "A 16-bit, 125 MS/s, 385 mW, 78.7 dB SNR CMOS Pipeline ADC", IEEE Journal of Solid-State Circuits, 44(12), (Dec. 2009), 9 pgs.

Lim, Yong, et al., "A 1 mW 71.5 dB SNDR 50 MS/s 13 bit Fully Differential Ring Amplifier Based SAR-Assisted Pipeline ADC", IEEE Journal of Solid-State Circuits, 50(12), (Dec. 2015), 11 pgs.

Majid, Hasmayadi Abdul, et al., "Design and Implementation of a 10-bit SAR ADC", International Journal of Electrical, Robotics, Electronics and Communications Engineering, 7(10), (2013), 4 pgs.

Nolan, Eric, et al., "Demystifying Auto-Zero Amplifiers—2", Analog Dialogue 34-3, (2000), 2 pgs.

Nolan, Eric, "Demystifying Auto-Zero Amplifiers—Part 1", Analog Dialogue 34-2, (2000), 3 pgs.

Verma, Naveen, et al., "A 25muW 100kS/s 12b ADC for Wireless Micro-Sensor Applications", IEEE International Solid-State Circuits Conference Session 12, (2006), 3 pgs.

\* cited by examiner

LOW NOISE ANALOG-TO-DIGITAL CONVERTER

FIELD OF THE DISCLOSURE

This document pertains generally, but not by way of limitation, to integrated circuits, and more particularly, to analog to digital converter circuits and systems.

BACKGROUND

In many electronics applications, an analog input signal is converted to a digital output signal (e.g., for further digital signal processing). For instance, in precision measurement systems, electronics are provided with one or more sensors to make measurements, and these sensors can generate an analog signal. The analog signal can then be provided to an analog-to-digital converter (ADC) circuit as input to generate a digital output signal for further processing. In another instance, in a mobile device receiver, an antenna can generate an analog signal based on the electromagnetic waves carrying information/signals in the air. The analog signal generated by the antenna can then be provided as input to an ADC to generate a digital output signal for further processing.

SUMMARY OF THE DISCLOSURE

Various analog-to-digital converter (ADC) topologies exist, including delta-sigma, pipelined converters, flash, and successive approximation register (SAR) converters. Noise sources in an ADC circuit can include kT/C sampling noise from a capacitor DAC circuit, noise coupling on to sampling capacitors from digital circuits and amplifier thermal noise. In conventional ADC architectures, kT/C sampling noise is inversely proportional to the size of the sampling capacitors; larger sampling capacitors can produce less noise. However, larger sampling capacitors can be difficult to drive and can physically occupy significant die area.

By using various techniques of this disclosure, the effect of these noise sources can be greatly reduced, allowing both lower noise conversion and smaller sampling capacitors, which can reduce the die area and reduce the power consumption of the ADC.

A non-limiting overview of certain aspects of the present subject matter follows immediately below.

Aspect 1 can include or use a method of operating an analog-to-digital converter (ADC) circuit to convert an analog input signal, the ADC circuit including a first capacitor circuit coupled to both an ADC input and a converter circuit, the method comprising: opening a first switch to decouple the first capacitor circuit from a bias voltage while the first capacitor circuit is receiving an estimate of a value of the input signal at or close to a subsequent sampling instance; after opening the first switch, opening a second switch in the converter circuit at the sampling instance while the first capacitor circuit is receiving the analog input signal, wherein the opening of the second switch samples a representation of an amplified difference signal that is generated between the estimate of the value of the analog input signal and the analog input signal; generating a digital output using the representation of the amplified difference signal; and adjusting the first capacitor circuit based on the digital output.

Aspect 2 can include or use, or can optionally be combined with Aspect 1 to use or include amplifying the difference signal by an amplifier arranged in a negative-feedback configuration.

Aspect 3 can include or use, or can optionally be combined with one or any combination of Aspects 1 through 2 to use or include sampling the analog input signal before the sampling instance to provide the estimate of the value of the analog input signal.

Aspect 4 can include or use, or can optionally be combined with one or any combination of Aspects 1 through 3 to use or include predicting a value of the analog input signal at or close to the sampling instance to provide the estimate of the value of the analog input signal.

Aspect 5 can include or use, or can optionally be combined with one or any combination of Aspects 1 through 4 to use or include wherein the prediction uses a derivative of the analog input signal.

Aspect 6 can include or use, or can optionally be combined with one or any combination of Aspects 1 through 5 to use or include dynamically reducing noise of the converter circuit.

Aspect 7 can include or use, or can optionally be combined with one or any combination of Aspects 1 through 6 to use or include wherein the first capacitor circuit includes a capacitor array forming part of a capacitive digital-to-analog converter (DAC) circuit, and wherein receiving the estimate of the value of the analog input signal includes: charging at least one capacitor in the first capacitor circuit to a voltage that is responsive to the analog input signal.

Aspect 8 can include or use, or can optionally be combined with one or any combination of Aspects 1 through 7 to use or include wherein the first capacitor circuit includes a capacitor array forming part of a capacitive digital-to-analog converter (DAC) circuit, and wherein receiving the estimate of the value of the analog input signal includes: applying a digital code to the DAC circuit representing the estimate of the value of the analog input signal.

Aspect 9 can include or use, or can optionally be combined with one or any combination of Aspects 1 through 8 to use or include applying a digital code to the capacitive digital-to-analog converter (DAC) circuit.

Aspect 10 can include or use, or can optionally be combined with one or any combination of Aspects 1 through 9 to use or include determining a digital value representative of a combination of the estimated value of the analog input signal and the sampled representation of the amplified difference signal.

Aspect 11 can include or use, or can optionally be combined with one or any combination of Aspects 1 through 10 to use or include wherein the first capacitor circuit includes a capacitor array forming part of a capacitive digital-to-analog converter (DAC) circuit, and using successive approximation to determine and apply a sequence of at least two digital codes to the capacitive digital-to-analog converter (DAC) circuit.

Aspect 12 can include or use an analog-to-digital converter (ADC) circuit configured to convert a value of an analog input signal, the ADC circuit comprising: a first capacitor circuit coupled to both an ADC input and a converter circuit and configured to store an estimate of the value of the analog input signal at a subsequent sampling instance; a second capacitor circuit configured to sample an amplified representation of a difference signal generated between the estimate of the value of the analog input signal and the analog input signal at the sampling instance; the converter circuit including the second capacitor circuit and an amplifier configured to process the difference signal, the converter circuit configured to generate a digital output using the sample stored by the second capacitor circuit; and a digital-to-analog converter (DAC) logic circuit configured to adjust the first capacitor circuit based on the digital output.

Aspect 13 can include or use, or can optionally be combined with one or any combination of Aspects 1 through 12 to use or include wherein the converter circuit is configured to generate a further digital output after an adjustment of the first capacitor circuit.

Aspect 14 can include or use, or can optionally be combined with one or any combination of Aspects 1 through 13 to use or include wherein the ADC circuit is configured to generate a digital value representing the value of the analog input signal, and wherein the digital value, at least in part, corresponds to or is determined from one or more converter circuit outputs generated after an adjustment of the first capacitor circuit.

Aspect 15 can include or use, or can optionally be combined with one or any combination of Aspects 1 through 14 to use or include wherein the amplifier is arranged in a negative-feedback configuration.

Aspect 16 can include or use, or can optionally be combined with one or any combination of Aspects 1 through 15 to use or include wherein the converter circuit further comprises: a dynamic filter circuit configured to reduce noise of the converter circuit.

Aspect 17 can include or use, or can optionally be combined with one or any combination of Aspects 1 through 16 to use or include wherein the first capacitor circuit includes a capacitor array forming part of a capacitive digital-to-analog converter (DAC) circuit, and wherein at least one capacitor in the first capacitor array is configured to be charged to a voltage that is responsive to the analog input signal.

Aspect 18 can include or use, or can optionally be combined with one or any combination of Aspects 1 through 17 to use or include wherein the DAC circuit is configured to a receive a representation of an output of an ADC sub-circuit that performs a conversion of the analog input signal.

Aspect 19 can include or use an analog-to-digital converter (ADC) circuit configured to convert an analog input signal, the ADC circuit comprising: means for storing an estimate of a value of the analog input signal at a subsequent sampling instance, the means for storing coupled to both an ADC input and a means for converting; means for sampling a representation of a difference signal generated between the estimate of the value of the analog input signal and the analog input signal at the sampling instance; the means for converting, including the means for sampling and an amplifier configured to process the difference signal, configured to generate an output using the sample stored by the means for sampling; and a digital-to-analog converter (DAC) logic circuit configured to adjust the means for storing based on the output of the means for converting.

Aspect 20 can include or use, or can optionally be combined with one or any combination of Aspects 1 through 19 to use or include means for predicting a value of the analog input signal at or close to the sampling instance to provide an estimate of the value of the analog input signal.

Aspect 21 can include or use, or can optionally be combined with one or any combination of Aspects 1 through 20 to use or include where a resolution of the DAC circuit is two or more bits less than a resolution of the digital value.

This overview is intended to provide an overview of subject matter of the present patent application. It is not intended to provide an exclusive or exhaustive explanation of the invention. The detailed description is included to provide further information about the present patent application.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

Various analog-to-digital converter (ADC) topologies exist, including delta-sigma, pipelined converters, flash, and successive approximation register (SAR) converters. Noise sources in an ADC circuit can include kT/C noise of a sampling capacitor, noise coupling on to sampling capacitors from digital circuits and amplifier noise. Also, charge injection from mismatch in sample switches can cause offsets. The kT/C sampling noise is inversely proportional to the size of the sampling capacitors, larger sampling capacitors can produce less noise. However, larger sampling capacitors can be difficult to drive and can physically occupy significant die area.

By using various techniques of this disclosure, these various noise sources can be largely canceled or reduced. As a result, the size of the sampling capacitors can be greatly reduced, while still achieving significantly improved noise performance and power efficiency for the overall converter. In the following description, various noise sources, including kT/C noise, digital noise and offsets are lumped together and described as a noise voltage "n".

Figure 1:
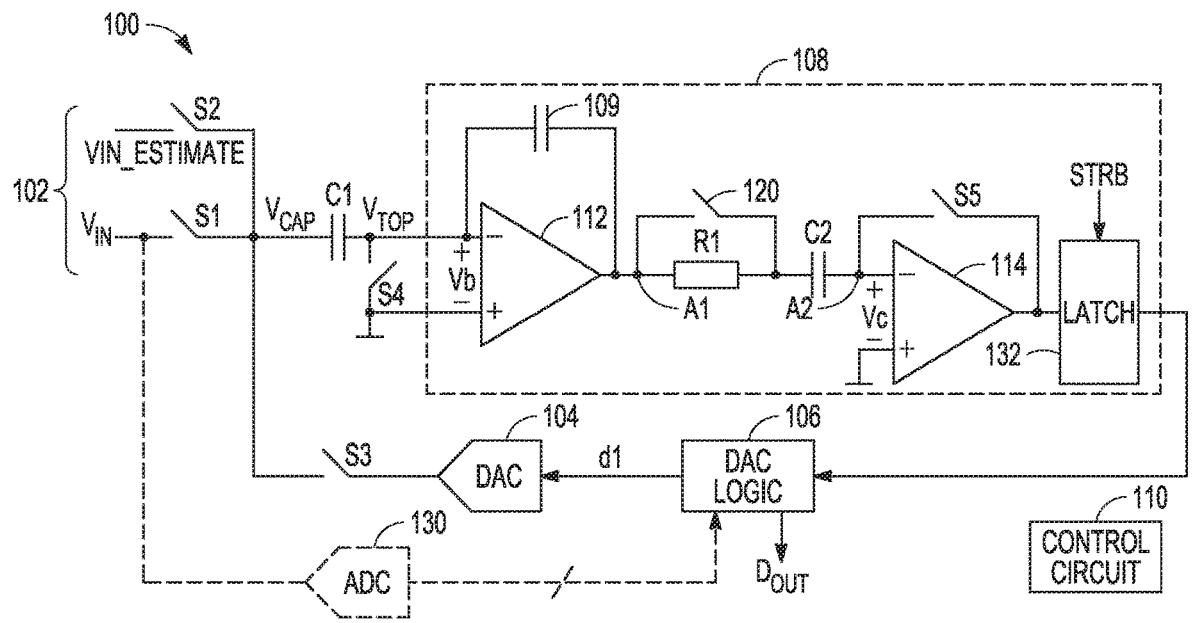
FIG. 1 is a simplified schematic diagram of an example of an ADC circuit that can implement various techniques of this disclosure.
Figure 4:
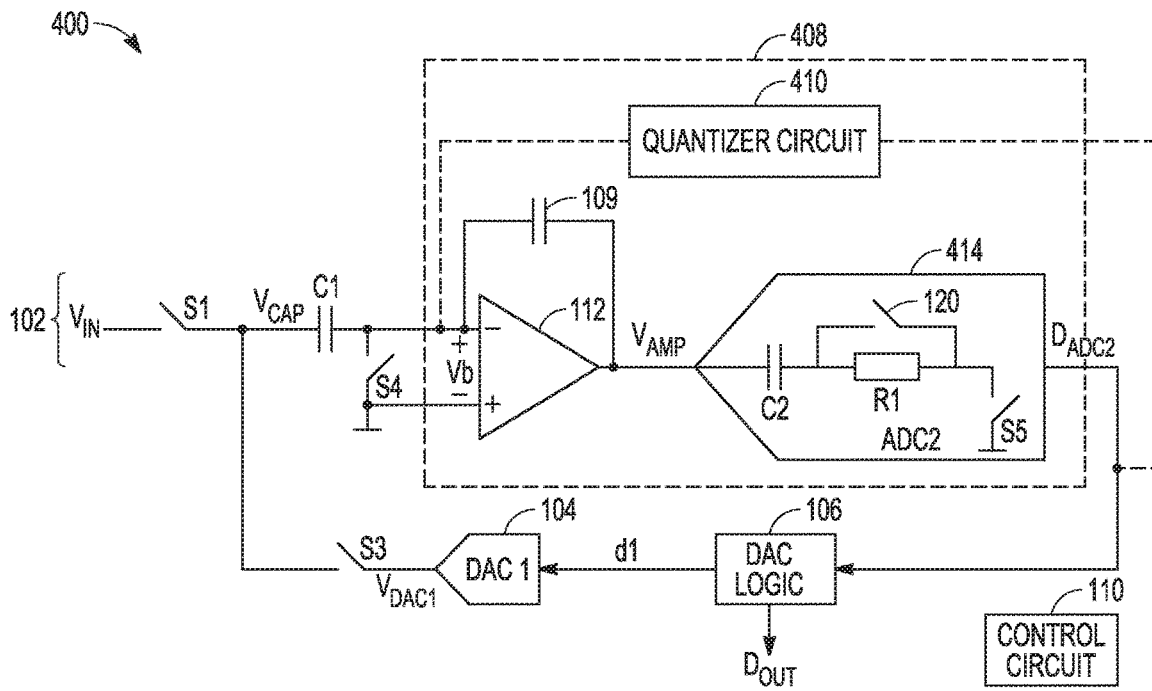
FIG. 4 is a simplified schematic diagram of another example of an ADC circuit that can implement various techniques of this disclosure.

FIG. 1 is a simplified schematic diagram of an example of an ADC circuit that can implement various techniques of this disclosure. The ADC circuit 100 can include a plurality of switches S1-S5, an ADC input 102, a DAC circuit 104, a DAC logic circuit 106, a control circuit 110, a converter circuit 108 including an amplifier circuit 112, e.g., with a gain G ideally greater than 1, such as 10, and a quantizer circuit 114, e.g., a comparator circuit, coupled to an output of the converter circuit 108. As seen in FIG. 1, the quantizer circuit 114 can be coupled to the output of the converter circuit 108 via a latch circuit 132 that can be controlled by a strobe signal ("STRB"). As shown in FIG. 4, in some example configurations, the converter circuit can include more than one output. Among other things, the control circuit 110 can control the operation of the switches S1-S5, for example.

An ADC input 102 can receive an analog input signal $V_{IN}$ and an estimated value of the analog input signal $V_{IN\_ESTIMATE}$. The analog input signal $V_{IN\_ESTIMATE}$ is the value of $V_{IN}$ that is estimated to occur at a sampling instance. The ADC circuit 100 can include a first capacitor circuit C1 coupled to both the ADC input 102 and the converter circuit 108, including the amplifier circuit 112. The quantizer circuit 114, coupled to the output of the amplifier circuit 112, can further include a second capacitor circuit C2. Optionally, and as described in more detail below, the ADC circuit 100 can include or be coupled to an ADC sub-circuit 130 that is coupled to analog input signal Vin. The ADC sub-circuit 130 can perform a coarse conversion of the analog input signal $V_{IN}$ and preload the DAC circuit 104 with the results of the conversion.

In some example configurations, the circuit 100 can include a buffer amplifier (not depicted) coupled to the ADC input to buffer the analog input signal prior to sampling the analog input signal. In some configurations, the quantizer circuit 114 can include a comparator circuit, which can be configured to perform an auto-zero operation to reduce or cancel an input offset voltage.

Optionally, in some example implementations, one or more impedance elements, such as resistors and/or capacitors, can be coupled to the amplifier circuit 112 in a negative feedback configuration. For example, using an optional feedback capacitor 109, the output of the amplifier circuit 112 can be coupled to the inverting input of the amplifier circuit 112 to create a virtual ground at the input of the amplifier circuit 112.

An output of the converter circuit 108 can be coupled to the DAC logic circuit 106. In some example implementations, the DAC logic circuit 106 can implement a successive approximation binary search or other search algorithm. The DAC logic circuit 106 can be coupled to an input of the DAC circuit 104 and can generate outputs "d1" to apply to the DAC circuit 104 during the successive approximation search process. In this manner, the ADC circuit 100 includes a feedback configuration in which the DAC circuit 104 can be responsive to an output of the converter circuit 108. The DAC circuit 104 can adjust the first capacitor circuit based on an output of the converter circuit 108.

In the following example operation of the ADC circuit 100, the DAC logic circuit 106 implements a successive approximation search. The optional ADC 130 is also not used. The operation of the ADC circuit 100 is shown and described below with respect to Table 1:

node Vcap in FIG. 1, and Column 9 on the right-hand side depicts the operation that occurs at the beginning or during each phase.

For purposes of explanation, the switches in this disclosure are assumed to be N-type enhancement mode field-effect transistors (FETs), although other types of transistors can be used and are considered within the scope of this disclosure. The operation of the ADC circuit of FIG. 1 will now be described with reference to Table 1 where a logic high signal ("1") corresponds to a closed switch and a logic low signal ("0") corresponds to an open switch.

At time T1 (row 1), the control circuit 110 controls the switches S2, S4, and S5 to close and the switches S1 and S3 to open. As part of acquisition phase 1, an estimated value of the analog input signal ("$V_{IN\_ESTIMATE}$") is fed, via switch S2, to the left-hand side plate of the first capacitor circuit C1. The right-hand side plate of C1 is shorted by the switch S4 to a bias or ground and the voltages at node A1 (the output of the amplifier circuit 112) and node A2 (the input of the quantizer circuit 114) are 0V.

In some example implementations, the signal $V_{IN\_ESTIMATE}$ can be derived from a previous conversion result. In other example implementations, the signal $V_{IN\_ESTIMATE}$ can be derived from an ADC sub-circuit, such as ADC1 in FIG. 5, or from a separate ADC circuit, or from $V_{IN}$ itself as shown in FIG. 4.

At time T2 (row 2), the control circuit 110 controls the switches S2 and S4 to open. Opening the switch S4 decouples the first capacitor circuit C1 from a bias voltage, e.g., ground or some other voltage, and samples the estimated voltage $V_{IN\_ESTIMATE}$ of the analog input signal on to C1. Opening the switch S4 results in a sampled noise voltage on C1 ("n" in Table 1) which is amplified or transferred to the output of the amplifier 112, e.g., node A1. More particularly, the voltage at node A1 takes on the value G*n, where G is the gain of the amplifier circuit 112. The voltage at the node A2 is 0V because the closed switch S5 results in the negative input of the quantizer circuit 114 being at virtual ground.

At time T3 (row 3), the control circuit 110 controls the switch S1 to close. As part of acquisition phase 2, an analog input signal $V_{IN}$ can be received, via the ADC input, and

TABLE 1

|    | S1 | S2 | S3 | S4 | S5 | A1 [V]              | A2 [V]        | Vcap                  | Operation                      |
|----|----|----|----|----|----|---------------------|---------------|-----------------------|--------------------------------|
| T1 | 0  | 1  | 0  | 1  | 1  | 0 V                 | 0 V           | $V_{IN\_ESTIMATE}$    | Acquisition phase 1            |
| T2 | 0  | 0  | 0  | 0  | 1  | G * (n)             | 0 V           | $V_{IN\_ESTIMATE}$    | Sample $V_{IN\_ESTIMATE}$      |
| T3 | 1  | 0  | 0  | 0  | 1  | G * ($V_{IN}$ – Ve + n) | 0 V       | $V_{IN}$              | Acquisition phase 2            |
| T4 | 0  | 0  | 0  | 0  | 0  | G * ($V_{IN}$ – Ve + n) | 0 V       | $Y_{IN}$ at "sampling instance" | Sample A1 at "sampling instance" |
| T5 | 0  | 0  | 1  | 0  | 0  | G * ($V_{DAC}$ – Ve + n) | SAR voltages | G * ($V_{DAC}$ – $V_{IN}$) | SAR operation to servo A2 to 0 V |
| T6 | 0  | 0  | 1  | 0  | 0  | G * ($V_{DAC}$ – Ve + n) | 0 V       | Vin                   | End of SAR operation Vin = Vdac |

Table 1 (above) depicts six rows (labeled "T1" through "T6") that represent time at the start of each phase of operation. Starting from the left-hand side of the table, columns 1-5 (labeled "S1" through "S5") depict the states of the switches S1-S5, respectively. Columns 6 and 7 (labeled "A1[V]" and "A2[V]") depict corresponding voltages at nodes A1 and A2 in FIG. 1. Column 8 depicts voltages at transferred by switch S1 to the node Vcap (the left-hand side plate of the first capacitor circuit C1).

The sampled noise component "n" and a difference between the analog input signal $V_{IN}$ and the sampled value of the estimated voltage $V_{IN\_ESTIMATE}$ of the analog input signal can be received and amplified by the amplifier circuit 112, resulting in a voltage of G*($V_{IN}$–Ve+n), where Ve equals $V_{IN\_ESTIMATE}$, at the node A1. As indicated above, in some configurations, at least one impedance element can be coupled to the amplifier circuit 112 in a negative-feedback configuration. With the capacitor 109 placed between the input and the output of the amplifier, as shown, the amplifier is in an inverting configuration and hence G can be negative. The voltage at the node A2 is 0V because the closed switch S5 results in the negative input of the quantizer circuit 114 still being at virtual ground.

If the switch S1 remains closed and if the analog input signal $V_{IN}$ moves, a moving difference is generated between the analog input signal $V_{IN}$ and the estimated value $V_{IN\_ESTIMATE}$, which is gained up by the amplifier circuit 112 and transferred to the second capacitor circuit C2 as a moving difference.

At time T4 (row 4), the control circuit 110 controls the switches S1 and S5 to open (so all the switches S1-S5 are open) to sample the voltage $G*(V_{IN}-Ve+n)$ on node A1 on to capacitor C2 at the 'sampling instance' of the ADC while the first capacitor circuit is receiving the analog input signal. The voltage of the analog input signal $V_{IN}$ and also on Vcap at the sampling instance is 'Vin at sampling instance'. Opening the switch S5 samples a representation of a combination of the noise voltage and a difference signal that is generated between the estimated value of the analog input signal and the analog input signal. Again, the analog input signal $V_{IN\_ESTIMATE}$ is the value of $V_{IN}$ that is estimated to occur at a sampling instance.

At time T5 (row 5), the control circuit 110 controls the switch S3 to close while the remaining switches S1, S2, S4, and S5 remain open. In this phase of operation, the voltage at node A2 is servoed to 0V over a number of quantizing steps of a successive approximation (SAR) search, of the analog input signal at the sampling instance. The DAC logic circuit 106 controls the DAC circuit 104 to adjust the first capacitor circuit C1 based on outputs of the converter circuit to perform a conversion. Using the DAC logic circuit 106 and the DAC circuit 104, the value of the Vcap node is adjusted. Each adjustment to the Vcap node causes a corresponding adjustment to the output voltage of amplifier 112 whose voltage is sensed by quantizer 114. Multiple adjustments to the Vcap node are made until the voltage at the right-hand side of the second capacitor circuit C2 is at or close to zero.

Looking at voltages on nodes A1, A2 and Vcap at T6, their voltages have returned to the values they were at in phase T4. At the very beginning of phase T4, Vcap node was driven by Vin and the voltage Vin was captured on Vcap. At time T6, Vcap is driven by DAC 104. For A2 to be at zero volts during both time T4 and T6, A1 and most importantly Vcap must also be at the same voltage. In other words, the DAC output voltage must be equal to Vin (at the sampling instance) and the conversion result is represented by the digital value at the input of DAC 104. In real implementations, A2 may not be at exactly 0V at T6, due to the finite resolution of the DAC. Note that the noise voltage "n" and the value of $V_{IN\_ESTIMATE}$ do not come in to play and so do not affect the accuracy of the conversion result.

It is also notable that the voltage stored across capacitor C2 at the instant of switch S5 opening (at time T4) is preserved throughout the conversion process. The converter 108 uses the sampled voltage across C2 to generate its digital outputs during the successive approximation process. While the converter uses C2, the actual voltage across C2 doesn't affect the digital values that drive the DAC 104 during the successive approximation. That digital value, and the corresponding DAC output voltage must equal Vin at the sampling instance at the end of conversion.

In a SAR operation, an analog input voltage $V_{IN}$ can be sampled and held using a sampling circuit and a differential output voltage of a digital-to-analog converter (DAC) circuit can be compared to the sampled and held voltage using a comparator circuit. The bit values of the DAC circuit can be adjusted based on the output of the comparator circuit. SAR operation is known to those of ordinary skill in the art and, for purposes of conciseness, will not be described in detail in this disclosure. An example SAR ADC is described in commonly assigned U.S. Pat. No. 7,432,844 to Mueck et al. and titled "DIFFERENTIAL INPUT SUCCESSIVE APPROXIMATION ANALOG TO DIGITAL CONVERTER WITH COMMON MODE REJECTION," the entire contents of which being incorporated herein by reference.

In optional phases of the conversion process, noise can be filtered, e.g., using a dynamic filter, to reduce a noise bandwidth of the difference signal (generated between the estimated value of the analog input signal and for example, the analog input signal at the sampling instance) amplified by amplifier circuit 112. As shown in FIG. 1, the ADC circuit 100 can include a dynamic filter that can include a resistive component R1, and a bypass switch 120 to bypass the resistive component R1. Additionally, or alternatively, the amplifier circuit 112 can include a dynamic filter circuit configured to perform bandwidth reduction.

To reduce noise sampled onto the second capacitor circuit C2, e.g., thermal noise of the amplifier, the resistive component R1 can initially be bypassed when switch 120 is closed, which can allow a voltage to quickly settle onto the second capacitor circuit C2. Once the voltage has settled, the control circuit 110 can open switch 120 thereby placing the resistive component R1 in series with the second capacitor circuit C2, which can band limit the noise on C2. As a non-limiting example, the resistor R1 can be about 1 kiloohm and the capacitor C2 can be about 0.4 pF, resulting in a bandwidth of about 400 megahertz.

It should be noted that the ADC circuit 100 need not perform all of the conversion. Optionally, in some example implementations, a second ADC circuit 130 can perform a first portion of the conversion and the ADC circuit 100 can perform a second, remaining portion. For example, the second ADC circuit 130, e.g., SAR, flash, sigma-delta, etc., can sample the analog input signal and provide the result to the DAC circuit 104. At the instant when the switch S4 or the switch S5 opens, for example, the separate ADC circuit 130 can also sample the analog input signal. The second ADC circuit 130 can then proceed to perform a conversion. After this portion of the overall conversion result is obtained from the second ADC circuit 130, the portion can be loaded onto the DAC circuit 104, and the remaining part of the conversion result can be obtained by operating the successive approximation search.

A benefit of using a separate converter circuit is that it can be much faster than the main converter circuit because the separate converter circuit attempts to resolve only a few bits, with lower demands on accuracy. Speeding up the overall conversion has the benefit of needing to keep circuits powered up for shorter spans of time, thereby reducing power.

In another example implementation for slow moving inputs, previous conversion results can be loaded onto the DAC circuit 104, and then some of the least significant bits (LSBs) bit trials can be retested to account for any change in the input from the previous sample to the present.

Figure 2:
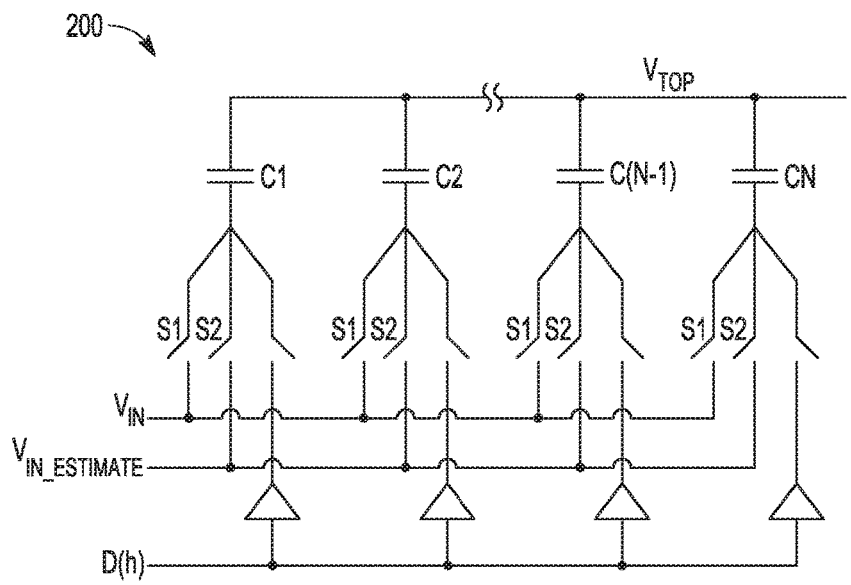
FIG. 2 is a schematic diagram of a portion of FIG. 1 depicting a capacitive digital-to-analog converter (CDAC) circuit that can form a part of the ADC circuit 100.

In some example configurations, the first capacitor circuit C1 can include a capacitor array having a capacitive digital-to-analog converter (DAC) circuit, such as shown in FIG. 2.

FIG. 2 is a schematic diagram of a portion of FIG. 1 depicting a capacitive digital-to-analog converter (CDAC) circuit that can form a part of the ADC circuit 100. In FIG. 2, the first capacitor circuit C1, S1 and S2 and also DAC 104 of FIG. 1 have been replaced by a capacitor array forming a part of a capacitive digital-to-analog converter (DAC) circuit 200. The CDAC circuit 200 can include capacitors C1-CN, a plurality of switches to couple one or more of the capacitors C1-CN to $V_{IN}$, a plurality of switches to couple one or more of the capacitors C1-CN to $V_{IN\_ESTIMATE}$, and a plurality of switches to couple one or more of the capacitors C1-CN to a driver, each controlled by a digital input code D(h). When capacitors are being controlled by the digital input, the effective voltage $V_{DAC}$ can be considered as a weighted sum of the voltages on the driven nodes of the capacitors.

In some such configurations, when receiving the estimated value $V_{IN\_ESTIMATE}$ of the analog input signal, at least one capacitor in the capacitor array can be charged to a voltage that is responsive to the analog input signal $V_{IN}$. For example, the charging can include biasing at least one terminal of the capacitor array to a voltage that is equal to or linearly related to the analog input signal, such as by using a filter circuit.

In some example configurations, such as seen in FIG. 2, a digital code D(h) can be applied to the CDAC circuit 200. For example, the control circuit 110 of FIG. 1 can apply a digital dither code D(h) to at least part of the CDAC circuit 200. In some example implementations, the DAC logic circuit 106 can apply a dither code during a sampling of the analog input signal $V_{IN\_ESTIMATE}$ before the switch S4 has opened. In other example implementations, the control circuit 110 can apply a dither code after the sampling of the analog signal $V_{IN\_ESTIMATE}$, after the switch S4 has opened, but before a conversion.

As described above with respect to FIG. 1, the analog input signal $V_{IN}$ sampled at the sampling instance includes the difference signal (where the difference signal is the difference between the estimated value of the analog input signal $V_{IN\_ESTIMATE}$, and the actual value of $V_{IN}$ at the sampling instance). The DAC logic circuit 106 can control the CDAC circuit 200 to determine a digital value representative of the combination of the estimated value of the analog input signal and the sampled value of the difference signal. For example, in some implementations, the DAC logic circuit 106 can use successive approximation to determine and apply a sequence of at least two digital codes to the capacitive digital-to-analog converter (DAC) circuit to determine the digital value. While it is true that the sampled value of the difference signal contains the noise voltage "n", the digital representation of the combination of the estimated value of the analog input signal and the sampled value of the difference signal, which is used to drive the DAC circuit, doesn't. The output voltage of the DAC circuit at the end of the conversion process must equal Vin at the sampling instance, including neither the noise voltage "n", nor the estimated value of the analog input signal $V_{IN\_ESTIMATE}$.

Figure 3:
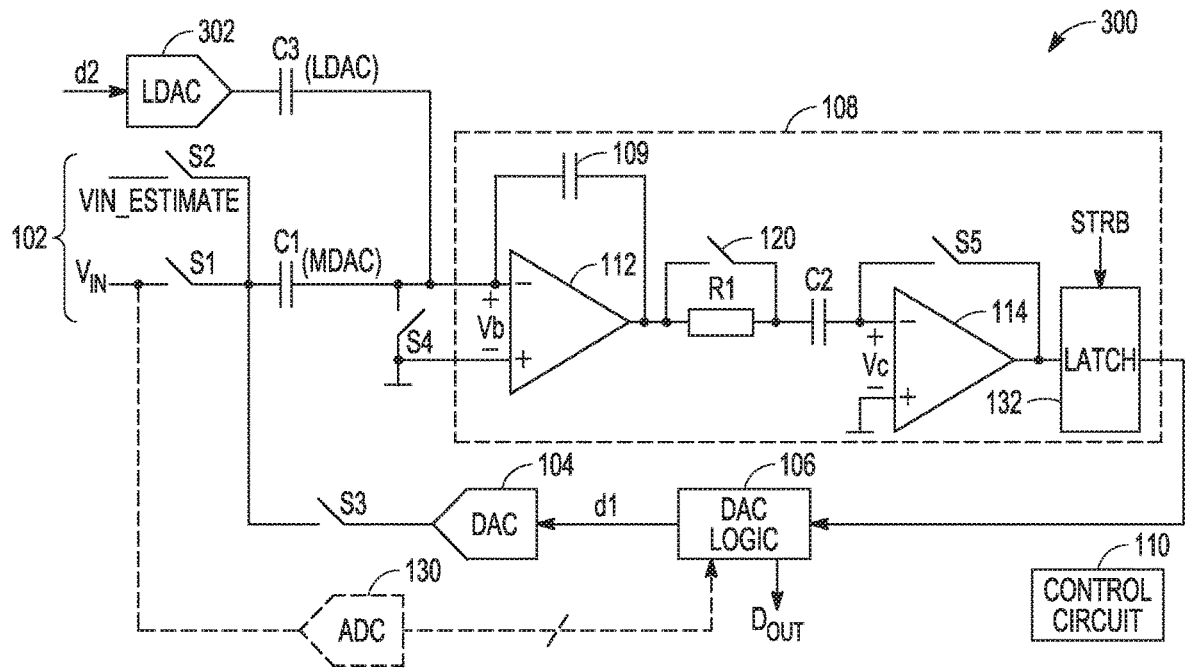
FIG. 3 is a simplified schematic diagram of another example of an ADC circuit that can implement various techniques of this disclosure.

FIG. 3 is a simplified schematic diagram of another example of an ADC circuit that can implement various techniques of this disclosure. The ADC circuit 300 of FIG. 3 can include components similar to those shown in FIG. 1, with like elements indicated by like reference numerals. In the ADC circuit 300 of FIG. 3, the capacitor circuit for the most significant bits (MSBs) is represented by the capacitor circuit C1, e.g., a capacitor array, coupled to the DAC circuit 104 and referred to as an "MDAC". Capacitors in the MDAC can be shuffled to improve linearity.

In addition, the ADC circuit 300 can include a capacitor circuit for the least significant bits (LSBs) that is represented by the capacitor C3, e.g., a capacitor array, coupled to the DAC circuit 302 and referred to as an "LDAC". The LDAC circuit can be coupled to the input of the amplifier circuit 112. Capacitors in the LDAC can be used to apply dither, e.g., dither d2 applied to the LDAC. In some example implementations, dither can be added to the MDAC. The LDAC and the MDAC can operate in combination to improve the linearity of ADC circuit 300.

Advantageously, using various techniques of this disclosure, the capacitors of the MDAC and the LDAC do not have to be sized with respect to noise performance because no matter what noise is sampled, the noise is canceled. That is, large capacitors are not needed for the MDAC and the LDAC to achieve a high SNR. Thus, the size of the sampling capacitors can be greatly reduced, which can reduce the die area and reduce the power consumption of the ADC. In this manner, a lower noise level can be achieved using the same power or, for the same noise level, less power can be used.

FIG. 4 is a simplified schematic diagram of another example of an ADC circuit that can implement various techniques of this disclosure. The ADC circuit 400 can include a plurality of switches S1, S3-S5, an ADC input 102, a DAC circuit 104 ("DAC1"), a DAC logic circuit 106, a control circuit 110, a converter circuit 408 including an amplifier circuit 112, e.g., with a gain G ideally greater than 1, such as 10, and a quantizer circuit 414, e.g., an analog-to-digital converter circuit ADC2. Among other things, the control circuit 110 can control the operation of the switches S1, S3-S5, for example. The ADC input 102 can receive an analog input signal $V_{IN}$. The ADC circuit 400 can include a first capacitor circuit C1 coupled to both the ADC input 102, the converter circuit 408 and an amplifier circuit 112. The quantizer circuit 414, coupled to the output of the amplifier circuit, can further include a second capacitor circuit C2 and a sampling switch S5.

In some example configurations, the ADC circuit 400 can include a buffer amplifier (not depicted) coupled to the ADC input to buffer the analog input signal prior to sampling the analog input signal. Optionally, in some example implementations, one or more impedance elements, such as resistors and/or capacitors, can be coupled to the amplifier circuit 112 in a negative feedback configuration. For example, using an optional feedback capacitor 109, the output of the amplifier circuit 112 can be coupled to the inverting input of the amplifier circuit 112 to create a virtual ground at the input of the amplifier circuit 112.

The output of the converter circuit, e.g. provided by the output of the quantizer circuit 414, can be coupled to the DAC logic circuit 106. The DAC logic circuit 106 can be coupled to an input of the DAC1 circuit 104 and can generate outputs "d1" to apply to the DAC1 circuit 104. In this manner, the ADC circuit 400 includes a feedback configuration in which the DAC circuit 104 can be responsive to an output of the converter circuit 408.

In this example configuration, the comparator 114 of FIG. 1 has been replaced with the quantizer circuit ADC2 414 and also the switch S2 has been removed, as the value of $V_{IN\_ESTIMATE}$ is captured in a different manner. Both modifications to FIG. 1 can be made on their own or in combination.

An example of the operation of the ADC circuit 400 is shown and described below with respect to Table 2:

TABLE 2

| | S1 | S3 | S4 | S5 | Vamp | Converter operation | Vcap | Operation |
|---|---|---|---|---|---|---|---|---|
| T1 | 1 | 0 | 1 | 1 | 0 V | | $V_{IN}$ | Acquire $V_{IN}$ |
| T2 | 1 | 0 | 0 | 1 | Vamp_0 = G * (n) | | $V_{IN}$ | Sample $V_{IN}$ |
| T3 | 1 | 0 | 0 | 1 | Vamp_1 = G * ($V_{IN}$ − Ve + n) | ADC2 acquire Vamp | $V_{IN}$ | ADC tracks Vin and ADC2 Acquires Vamp |
| T4 | 1 | 0 | 0 | 0 | Vamp_1 = G * ($V_{IN}$ − Ve + n) | ADC2 Sample and convert Vamp Result = $D_{ADC2\_1}$ | $V_{IN}$ at "sampling instance" | Sample Vamp at "sampling instance" |
| T5 | 0 | 1 | 0 | 1 | Vamp_2 = G * ($V_{DAC1\_1}$ − Ve + n) | ADC2 Aquire | $V_{DAC1\_1}$ | Load DAC1 with mid-scale value (for example) |
| T6 | 0 | 1 | 0 | 0 | Vamp_2 = G * ($V_{DAC1\_1}$ − Ve + n) | ADC2 Sample and Convert Vamp Result = $D_{ADC2\_2}$ | $V_{DAC1\_1}$ | |
| T7 | 0 | 1 | 0 | 1 | Vamp_3 = G * ($V_{DAC1\_2}$ − Ve + n) | ADC2 Acquire | $V_{DAC1\_2}$ | Modify DAC1 input from ADC2 result to reduce $V_{AMP}$ magnitude. DAC1 input = $D_{DAC1\_2}$ |
| T8 | 0 | 1 | 0 | 0 | Vamp_3 = G * ($V_{DAC1\_2}$ − Ve + n) | ADC2 Sample and Convert. Final Result = $D_{ADC2\_3}$ | $V_{DAC1\_3}$ | Repeat T6 & T7 using successive approximation until $D_{ADC2}$ is not over loeaded. |

Table 2 (above) depicts eight rows (labeled "T1" through "T8") that represent time at the start of each phase of operation. Starting from the left-hand side of the table, columns 1-4 (labeled "S1", "S3", "S4" and "S5") depict the states of the switches S1 and S3-S5, respectively. Column 5 (labeled "Vamp") depicts the voltage at node Vamp at the input of the quantizer circuit 414 ("ADC2") of FIG. 4. Column 6 (labeled "Converter operation") depicts the operation of a corresponding ADC and/or DAC in the ADC circuit 400. Column 7 depicts voltages at node Vcap in FIG. 4, and Column 8 on the right-hand side depicts the operation that occurs at the beginning or during the phase.

At time T1 (row 1), the control circuit 110 controls the switches S1, S4 and S5 to close and the switch S3 to open. In this acquisition phase, the analog input signal $V_{IN}$ is fed to the left-hand side plate of the first capacitor circuit C1. The right-hand side plate of C1 is shorted by the switch S4 to a bias voltage or ground and the voltage at node Vamp (the output of the amplifier circuit 112) is 0V.

At time T2 (row 2), the control circuit 110 controls the switches S4 to open. Opening the switch S4 decouples the first capacitor circuit C1 from a bias voltage, e.g., ground or some other voltage, and samples the value $V_{IN}$ on to C1. The value of Vin when S4 opens, in this example configuration, is an estimate of the value of $V_{IN}$ at the sample instance and is called $V_{IN\_ESTIMATE}$. Opening the switch S4 results in a noise voltage on the first capacitor circuit C1 ("n" in Table 1) which is transferred to the output of the amplifier 112, e.g., node Vamp. More particularly, the voltage at node Vamp is G*(n), where G is the gain of the amplifier circuit 112 and "n" is the noise voltage component generated from opening the switch S4.

During the phase T3 a noise voltage "n" and a difference between the analog input signal $V_{IN}$ and the sampled value of the estimated voltage $V_{IN\_ESTIMATE}$ of the analog input signal can be received and amplified by the amplifier circuit 112, resulting in a voltage of G*($V_{IN}$−Ve+n), where Ve equals $V_{IN\_ESTIMATE}$, at the node Vamp. As indicated above, in some configurations, at least one impedance element can be coupled to the amplifier circuit 112 in a negative-feedback configuration.

If the switch S1 remains closed and if the analog input signal $V_{IN}$ moves, a moving difference is generated between the analog input signal $V_{IN}$ and the estimated value $V_{IN\_ESTIMATE}$, which is gained up by the amplifier circuit 112 and transferred to the second capacitor circuit C2 as a difference. If the analog input signal $V_{IN}$ does not move, then the estimated value $V_{IN\_ESTIMATE}$ equals the analog input signal $V_{IN}$ at the sampling instance, there is no voltage change at the output node Vamp of the amplifier circuit 112, and only G*n is stored on the second capacitor circuit C2.

At time T4 (row 4), the control circuit 110 controls the switch S5 (of ADC2 in FIG. 4) to open to sample the voltage G*($V_{IN}$−Ve+n) on node Vamp on to capacitor C2 at the 'sampling instance' of the ADC while the first capacitor circuit C1 is receiving the analog input signal. Opening of the switch S5 samples a representation of the combination of the noise voltage and a difference signal that is generated between the estimated value of the analog input signal and the analog input signal.

The quantizer circuit ADC2 of FIG. 4 converts the sampled voltage and the digital result is $D_{ADC2\_1}$. The voltage of the analog input signal $V_{IN}$ and also on the node Vcap at the sampling instance is '$V_{IN}$ at sampling instance'.

To minimize gain error caused by the amplifier circuit 112, it is desirable that the voltage on the node Vamp is close to zero. Using the techniques below, the output $D_{ADC2}$ of the ADC2 circuit 414 can modify the DAC1 circuit 104 that can, in turn, generate a smaller voltage on the node Vamp until that voltage is firstly within an input range of ADC2 circuit 414 and secondly close to zero (if it is required to reduce the impact of gain error in the amplifier circuit 112). In this manner, the DAC logic circuit 106 can adjust the first capacitor circuit C1 based on an output of the converter circuit to perform a conversion of the analog input signal at the sampling instance.

At time T5 (row 5), the control circuit 110 controls the switches S3 and S5 to close and the switch S1 to open. In this phase, the voltage at node Vamp is $G^*(V_{DAC1\_1}-Ve+n)$. The DAC logic circuit 106 loads the DAC1 circuit 104 to a mid-scale value $V_{DAC1\_1}$, for example. The DAC1 circuit 104 can generate the voltage $V_{DAC1\_1}$, which is the voltage at the node Vcap. In this phase S5 is closed and ADC2 414 is in an acquire mode.

At time T6 (row 6), the control circuit 110 controls the switch S5 to open and the ADC2 circuit 414 of FIG. 4 samples and converts the voltage on the node Vamp, or $G^*(V_{DAC1\_1}-Ve+n)$, with the digital result being $D_{ADC2\_2}$.

At time T7 (row 7), the control circuit 110 controls the switch S5 to close. To reduce the magnitude of the voltage at node Vamp, the DAC logic circuit 106 modifies the DAC1 circuit 104 input based on the output $D_{ADC2\_2}$ of ADC2 circuit 414. The ADC2 circuit 414 of FIG. 4 acquires the voltage on node Vamp, or $G^*(V_{DAC1\_2}-Ve+n)$.

At time T8 (row 8), the control circuit 110 controls the switch S5 to open and the ADC2 circuit 414 of FIG. 4 samples and converts the voltage on the node Vamp, or $G^*(V_{DAC1\_2}-Ve+n)$, with the digital result being $D_{ADC2\_3}$. The voltage on the node Vcap is $V_{DAC1\_3}$. The operations described in times T6 and T7 can be repeated, e.g., using successive approximation, until the output $D_{ADC2}$ of the ADC2 circuit 414 is not overloaded and is ideally close to zero. The conversion of the signal $V_{IN}$ at the sampling instance can be calculated from ADC2 conversion results and the final DAC1 input value, as shown and derived below where N is the resolution of ADC2 and Vref is ADC2's reference voltage:

$$D_{ADC2_1} = g*(V_{in} - V_e + n), \quad \text{Equation (1)}$$

$$D_{ADC2_3} = g*(V_{DAC1_3} - V_e + n), \quad \text{Equation (2)}$$

$$D_{ADC2_1} - D_{ADC2_3} = g*(V_{in} - V_{DAC1_3}), \quad \text{Equation (3)}$$

$$Vin = \frac{D_{ADC2_1} - D_{ADC2_3}}{g} + V_{DAC1_3}, \quad \text{Equation (4)}$$

$$Vin = \frac{D_{ADC2_1} - D_{ADC2_3}}{g} + D_{DAC1_3}, \quad \text{Equation (5)}$$

where $$g = \frac{G*2^N}{Vref}. \quad \text{Equation (6)}$$

Note that both Ve and "n" are subtracted out in Equation (3) and so do not affect the accuracy of the conversion. In optional phases of the conversion process, noise from switches, the amplifier 112 or on the input Vin can be filtered, e.g., using a dynamic filter, to reduce a noise bandwidth of the difference signal (generated between the estimated value of the analog input signal and for example, the analog input signal at the sampling instance) amplified by amplifier circuit 112. As shown in FIG. 4, the ADC2 circuit 414 can include a dynamic filter that can include a resistive component R1, and a bypass switch 120 to bypass the resistive component R1, as described above with respect to FIG. 1.

As mentioned above, in some example configurations, the converter circuit 408 can include more than one output. For example, the converter circuit 408 can optionally include a second quantizer circuit 410, e.g., a comparator circuit or ADC circuit, that can provide a second output of the converter circuit 408.

As shown in FIG. 4, an input of the second quantizer circuit 410 can be coupled to the input of the amplifier circuit 112, e.g., the node on the right-hand side plate of the first capacitor circuit C1. Alternatively, in some example configurations, an input of the second quantizer circuit 410 can be coupled to the output of the amplifier circuit 112, e.g., the node Vamp.

The output of the second quantizer circuit 410 can provide a result to a second output of the converter circuit 408 which may be provided faster than can be provided by the first quantizer. As such, the converter circuit 410 can include at least a first output (from the ADC2 circuit) and a second output (from the second quantizer circuit 410).

The second output of the converter circuit 408 (from the second quantizer circuit 410) can be used, for example, for a portion, e.g., an initial portion, of the successive approximation search and used to adjust the DAC1 circuit 104 until Vamp is within the full-scale range of ADC2 414.

With ADC2 being a multi-bit quantizer, the least significant bits can be determined by ADC2 with fewer modifications to DAC1 than would be required if the quantizer input had to be driven to close to 0V, as is required in the circuit shown in FIG. 1. As a result, the circuit shown in FIG. 4 can be expected to be faster and DAC1 can be have a resolution of two or more bits less than the resolution of the overall conversion result (the digital value).

Figure 5:
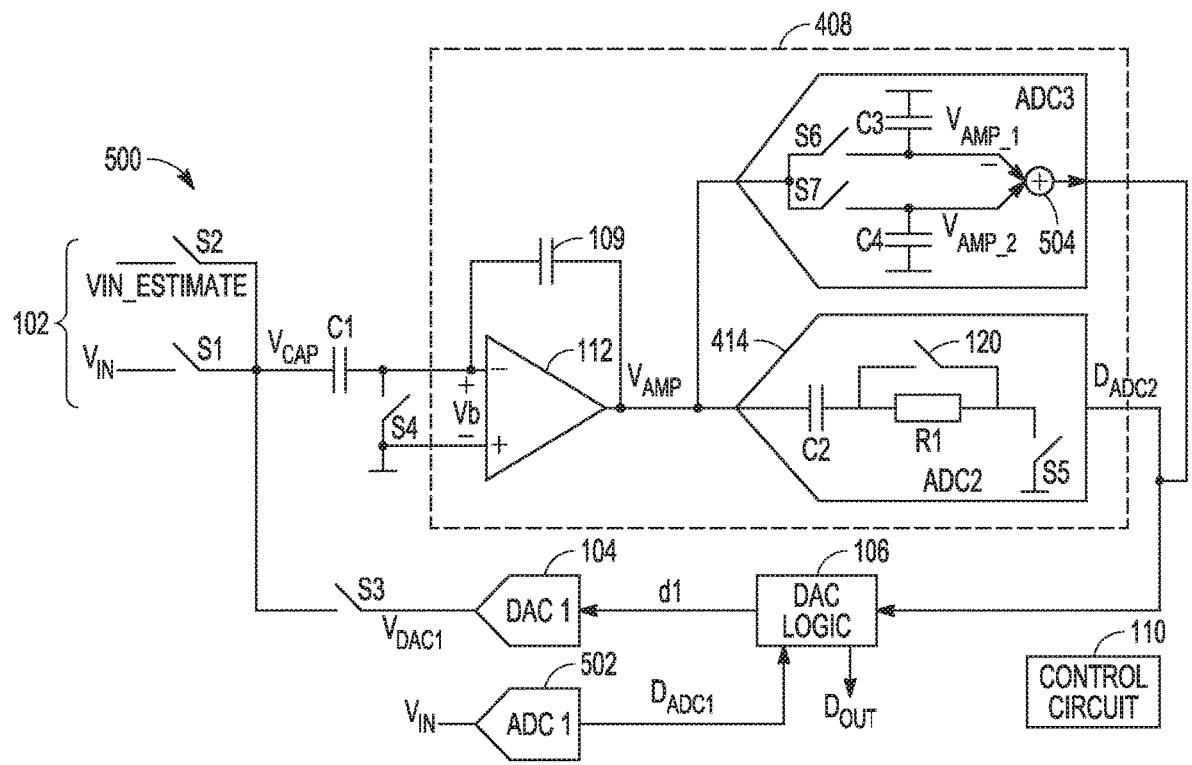
FIG. 5 is a simplified schematic diagram of another example of an ADC circuit that can implement various techniques of this disclosure.

FIG. 5 is a simplified schematic diagram of another example of an ADC circuit that can implement various techniques of this disclosure. The ADC circuit 500 can include a plurality of switches S1-S5, an ADC input 102, a DAC circuit 104 ("DAC1"), a DAC logic circuit 106, a control circuit 110, a converter circuit 408 including an amplifier circuit 112, e.g., with a gain G ideally greater than 1, such as 10, a quantizer circuit 414, e.g., an analog-to-digital converter circuit ADC2, coupled to an output of the converter circuit 408. Among other things, the control circuit 110 can control the operation of the switches S1-S5, for example.

In addition, the ADC circuit 500 of FIG. 5 can include an ADC circuit 502 ("ADC1") that receives an analog input voltage $V_{IN}$ and outputs a digital representation $D_{ADC1}$ that is fed to the DAC logic and control circuit 106.

The ADC input 102 can receive an analog input signal $V_{IN}$ and an estimated value of the analog input signal $V_{IN\_ESTIMATE}$. The ADC circuit 100 can include a first capacitor circuit C1 coupled to both the ADC input 102 and an amplifier circuit 112. The quantizer circuit 414, coupled to the output of the amplifier circuit, can further include a second capacitor circuit C2 and a sampling switch S5.

In some example configurations, the circuit 500 can include a buffer amplifier (not depicted) coupled to the ADC input to buffer the analog input signal prior to sampling the analog input signal. Optionally, in some example implementations, one or more impedance elements, such as resistors and/or capacitors, can be coupled to the amplifier circuit 112 in a negative feedback configuration. For example, using an optional feedback capacitor 109, the output of the amplifier circuit 112 can be coupled to the inverting input of the amplifier circuit 112 to create a virtual ground at the input of the amplifier circuit 112.

An output of the converter circuit 408 can be coupled to the DAC logic circuit 106. In some example implementations, the DAC logic circuit 106 can implement a successive approximation (SAR) search. The DAC logic circuit 106 can be coupled to an input of the DAC circuit 104 and can generate outputs "d1" to apply to the DAC circuit 104, e.g., during a SAR process. In this manner, the ADC circuit 500 includes a feedback configuration in which the DAC circuit 104 can be responsive to an output of the converter circuit 408.

The ADC circuit 500 can include an additional converter circuit ADC3 containing switches S6 and S7, and capacitors C3 and C4. An example of the operation of the ADC circuit 500 is shown and described below with respect to Table 3. For the purposes of this example, we will ignore the converter circuit ADC3.

quantizer circuit 414 of FIG. 4. Column 7 (labeled "Converter operation") depicts the operation of a corresponding ADC and/or DAC in the ADC circuit 500. Column 8 depicts voltages at node Vcap in FIG. 5, and Column 9 on the right-hand side depicts the operation that occurs at the beginning or during each phase.

At time T1 (row 1), the control circuit 110 controls the switches S2, S4, and S5 to close and the switches S1 and S3 to open. In this acquisition phase, an estimated value of the analog input signal ("$V_{IN\_ESTIMATE}$") is fed, via switch S2, to the left-hand side plate of the first capacitor circuit C1. The right-hand side plate of C1 is shorted by the switch S4 to a bias voltage or ground and the voltage at node Vamp (the output of the amplifier circuit 112) is 0V.

At time T2 (row 2), the control circuit 110 controls the switches S2 and S4 to open. Opening the switch S4 decouples the first capacitor circuit C1 from a bias voltage, e.g., ground or some other voltage, and samples the estimated voltage $V_{IN\_ESTIMATE}$ of the analog input signal on to C1. Opening the switch S4 results in a noise voltage on C1 ("n" in Table 1) which is transferred to the output of the amplifier 112, e.g., node Vamp. More particularly, the volt-

TABLE 3

| | S1 | S2 | S3 | S4 | S5 | Vamp | Converter operation | Vcap | Operation |
|---|---|---|---|---|---|---|---|---|---|
| T1 | 0 | 1 | 0 | 1 | 1 | 0 V | ADC1 Acquire $V_{IN}$ | $V_{IN\_ESTIMATE}$ | Aquire $V_{IN\_ESTIMATE}$ |
| T2 | 0 | 0 | 0 | 0 | 1 | Vamp_0 = G * (n) | ADC1 Sample | $V_{IN\_ESTIMATE}$ | Sample $V_{IN\_ESTIMATE}$ |
| T3 | 1 | 0 | 0 | 0 | 1 | Vamp_1 = G * ($V_{IN}$ − Ve + n) | ADC1 Convert $V_{IN}$ Result = $D_{ADC1\_1}$ ADC2 Acquire | $V_{IN}$ | |
| T4 | 1 | 0 | 0 | 0 | 0 | Vamp_1 = G * ($V_{IN}$ − Ve + n) | ADC2 Sample and convert Vamp Result = $D_{ADC2\_1}$ | $V_{IN}$ at "sampling instance" | Sample Vamp at "sampling instance" |
| T5 | 0 | 0 | 1 | 0 | 1 | Vamp_2 = G * ($V_{DAC1\_1}$ − Ve + n) | ADC2 Acquire | $V_{DAC1\_1}$ | Load DAC1 from ADC1 result |
| T6 | 0 | 0 | 1 | 0 | 0 | Vamp_2 = G * ($V_{DAC1\_1}$ − Ve + n) | ADC2 Sample and Convert Vamp Result = $D_{ADC2\_2}$ | $V_{DAC1\_1}$ | |
| T7 | 0 | 0 | 1 | 0 | 1 | Vamp_3 = G * ($V_{DAC1\_2}$ − Ve + n) | ADC2 Aquire | $V_{DAC1\_2}$ | Modify DAC1 input based on ADC2 result(s) to reduce VAMP magnitude. DAC1 input = $D_{DAC1\_2}$ |
| T8 | 0 | 0 | 1 | 0 | 0 | Vamp_3 = G * ($V_{DAC1\_2}$ − Ve + n) | ADC2 Sample and Convert. Result = $D_{ADC2\_3}$ | $V_{DAC1\_2}$ | |

Table 3 (preceding) depicts eight rows (labeled "T1" through "T8") that represent time at the start of each phase of operation. Starting from the left-hand side of the table, columns 1-5 (labeled "S1" through "S5") depict the states of the switches S1-S5, respectively. Column 6 (labeled "Vamp") depicts the voltage at node Vamp at the input of the age at node Vamp is G*(n), where G is the gain of the amplifier circuit 112 and "n" is the noise voltage component generated from opening the switch S4.

At time T3 (row 3), the control circuit 110 controls the switch S1 to close. In this acquisition phase, an analog input signal $V_{IN}$ can be received, via the ADC input, and transferred by switch S1 to the node Vcap (the left-hand side plate of the first capacitor circuit C1).

A voltage equivalent to the noise voltage component "n" and a difference between the analog input signal $V_{IN}$ and the sampled value of the estimated voltage $V_{IN\_ESTIMATE}$ of the analog input signal can be received and amplified by the amplifier circuit 112, resulting in a voltage of $G*(V_{IN}-Ve+n)$, where Ve equals $V_{IN\_ESTIMATE}$, at the node Vamp. As indicated above, in some configurations, at least one impedance element can be coupled to the amplifier circuit 112 in a negative-feedback configuration.

If the switch S1 remains closed and if the analog input signal $V_{IN}$ moves, a moving difference is generated between the analog input signal $V_{IN}$ and the estimated value $V_{IN\_ESTIMATE}$, which is gained up by the amplifier circuit 112 and transferred to the second capacitor circuit C2 as a difference.

At time T4 (row 4), the control circuit 110 controls the switch S5 (of ADC2 414 in FIG. 5) to open to sample the voltage $G*(V_{IN}-Ve+n)$ on node Vamp on to capacitor C2 at the 'sampling instance' of the ADC while the first capacitor circuit is receiving the analog input signal $V_{IN}$. Opening the switch S5 samples a representation of a combination of the noise voltage and a difference signal that is generated between the estimated value of the analog input signal and the analog input signal. The ADC2 circuit 414 of FIG. 5 converts the sampled voltage and the digital result is $D_{ADC2\_1}$. The voltage of the analog input signal $V_{IN}$ and also on the node Vcap at the sampling instance is '$V_{IN}$ at sampling instance'.

As seen in FIG. 5, the ADC circuit 500 can include an ADC1 circuit 502 coupled to the DAC logic circuit 106. The ADC1 circuit 502 can receive the analog input signal $V_{IN}$ and output a digital representation $D_{ADC1}$, which is loaded into the DAC1 circuit 104 (via the DAC logic circuit 106). As a result, the voltage on node Vcap changes, and the voltage on node Vamp changes.

At time T5 (row 5), the control circuit 110 controls the switches S3 and S5 to close and the switch S1 to open. In this phase, the voltage at node Vamp is $G*(V_{DAC1\_1}-Ve+n)$. The DAC logic circuit 106 can load the DAC circuit 104 using the output $D_{ADC1}$ of the ADC1 circuit 502 and the DAC1 circuit 104 can generate an output voltage $V_{DAC1\_1}$, which is the voltage at the node Vcap.

To minimize or eliminate any gain error caused by the amplifier circuit 112, it is desirable that the voltage on the node Vamp is close to zero. Using the techniques below, the output $D_{ADC2}$ of the ADC2 circuit 414 can modify the DAC1 circuit 104 that can, in turn, generate a smaller voltage on the node Vamp.

At time T6 (row 6), the control circuit 110 controls the switch S5 to open and the ADC2 circuit 414 of FIG. 5 samples and converts the voltage on the node Vamp, or $G*(V_{DAC1\_1}-Ve+n)$, with the digital result being $D_{ADC2\_2}$.

At time T7 (row 7), the control circuit 110 controls the switch S5 to close. To reduce the magnitude of the voltage at node Vamp, the DAC logic circuit 106 modifies the DAC1 circuit 104 input based on the output $D_{ADC2\_2}$ of ADC2, e.g., an output of the converter circuit 408, to perform a conversion of the analog input signal at the sampling instance. The voltage on the node Vcap is $V_{DAC1\_2}$. The ADC2 circuit 414 of FIG. 5 acquires the voltage on node Vamp, or $G*(V_{DAC1\_2}-Ve+n)$.

At time T8 (row 8), the control circuit 110 controls the switch S5 to open and the ADC2 circuit 414 of FIG. 5 samples and converts the voltage on the node Vamp, or $G*(V_{DAC1\_2}-Ve+n)$, with the digital result being $D_{ADC2\_3}$. The final result is the combination of the DAC word of DAC1 circuit 104 and outputs of the ADC circuit 500. As before, $V_{IN}$ is given by the following equations:

$$Vin = \frac{D_{ADC2_1} - D_{ADC2_3}}{g} + D_{DAC1_3}. \qquad \text{Equation (7)}$$

In some example configurations, the DAC1 value can be modified, e.g., by adjusting the lower order bits, to reduce the voltage at the node Vamp to a value close to zero for the final ADC2 conversion. This optional operation can reduce the effect of any error in the amplifier gain G.

In another example configuration, the DAC1 value can be modified instead, e.g., by adjusting the lower order bits, to make the voltage Vamp_3 close to the voltage Vamp_1. This optional operation can reduce the resolution required for ADC2 circuit 414 by modifying ADC2 to convert the smaller amount Vamp_3-Vamp_1.

The converter circuit 408 can optionally include an auxiliary ADC circuit ADC3, which can include two sampling capacitors C3 and C4 and two corresponding sampling switches S6 and S7, and an adder circuit 504. Table 4 depicts the operation of this example:

TABLE 4

| | S1 | S2 | S3 | S4 | S5 | S6 | S7 | Vamp | Converter operation | Vcap | Operation |
|---|---|---|---|---|---|---|---|---|---|---|---|
| T1 | 0 | 1 | 0 | 1 | 1 | 1 | 0 | 0 V | ADC1 Acquire $V_{IN}$ | $V_{IN\_ESTIMATE}$ | Aquire $V_{IN\_ESTIMATE}$ |
| T2 | 0 | 0 | 0 | 0 | 1 | 1 | 0 | Vamp_0 = G * (n) | ADC1 Sample | $V_{IN\_ESTIMATE}$ | Sample $V_{IN\_ESTAMATE}$ |
| T3 | 1 | 0 | 0 | 0 | 1 | 1 | 0 | Vamp_1 = G * ($V_{IN}$ – Ve + n) | ADC1 Convert $V_{IN}$ Result = $D_{ADC1\_1}$ ADC2 and ADC3 (using C3) Acquire | $V_{IN}$ | |
| T4 | 1 | 0 | 0 | 0 | 0 | 0 | 0 | Vamp_1 = G * ($V_{IN}$ – Ve + n) | ADC2 and ADC3 (using C3) Sample Vamp voltage | $V_{IN}$ at "sampling instance" | Sample Vamp at "sampling instance" |
| T5 | 0 | 0 | 1 | 0 | 0 | 0 | 1 | Vamp_2 = G * ($V_{DAC1\_1}$ – Ve + n) | ADC3 (using C4) Acquire Vamp voltage | $V_{DAC1\_1}$ | Load DAC1 from ADC1 result |

TABLE 4-continued

| | S1 | S2 | S3 | S4 | S5 | S6 | S7 | Vamp | Converter operation | Vcap | Operation |
|---|---|---|---|---|---|---|---|---|---|---|---|
| T6 | 0 | 0 | 1 | 0 | 0 | 0 | 0 | Vamp_2 = G * ($V_{DAC1\_1}$ − Ve + n) | ADC3 (using C4) Sample and Convert Vamp_2−Vamp_1 Result = $D_{ADC3}$ | $V_{DAC1\_1}$ | |
| T7 | 0 | 0 | 1 | 0 | 0 | 0 | 0 | Vamp_3 = G * ($V_{DAC1\_2}$ − Ve + n) | ADC2 Sense Vamp_3−Vamp_1 | $V_{DAC1\_1}$ | Modify DAC1 input based on ADC3 result(s), $D_{ADC3}$, to reduce Vcap-$V_{IN}$ magnitude DAC1 input = $D_{DAC1\_2}$ |
| T8 | 0 | 0 | 1 | 0 | 0 | 0 | 0 | Vamp_3 = G * ($V_{DAC1\_2}$ − Ve + n) | ADC2 Convert Vamp_3−Vamp_1 Result = $D_{ADC2}$ | $V_{DAC1\_2}$ | |

The operations at T1 and T2 are identical to Table 3, except that an additional switch S6 is closed.

At time T3, the control circuit 110 controls the switch S1 to close. Both ADC2 and ADC3 (using C3) acquire the voltage at the node of Vamp.

At time T4, the control circuit 110 controls the switches S5 and S6 to open simultaneously to sample the Vamp voltage onto the capacitors C2 and C3. The sampled voltage of Vamp is Vamp_1.

At time T5, the control circuit 110 controls the switches S3 and S7 to close and the switch S1 to open. In this phase, the voltage at node Vamp is Vamp_2, which equals G*($V_{DAC1\_1}$−Ve+n). The DAC logic circuit 106 can load the DAC circuit 104 using the output $D_{ADC1}$ of the ADC1 circuit 502 and the DAC1 circuit 104 can generate an output voltage $V_{DAC1\_1}$, which is the voltage at the node Vcap.

At time T6 (row 6), the control circuit 110 controls the switch S7 to open and the ADC circuit ADC3 samples the voltage on the node Vamp, where Vamp_2=G*($V_{DAC1\_1}$−Ve+n). Then the voltage difference stored on C3 and C4 in ADC3, Vamp_2−Vamp_1, is converted to the digital result being $D_{ADC3}$.

At time T7, a new DAC1 code, $D_{DAC1\_2}$, is generated based on $D_{ADC3}$ and $D_{DAC1\_1}$. The control circuit 110 can apply the new code $D_{DAC1\_2}$ to DAC1, and the Vcap voltage equals $V_{DAC1\_2}$. The voltage of Vamp is Vamp_3 and can be adjusted closer to Vamp_1 by the code $D_{DAC1\_2}$. The capacitor C2 left side voltage is shifted from Vamp_1 to Vamp_3, and its right side voltage is shifted from 0 to Vamp_3−Vamp_1. Because both Vamp_3 and Vamp_1 contain the noise "n", the subtraction result does not contain the noise "n". At time T8, the ADC circuit ADC2 right side voltage, Vamp_3−Vamp_1, is converted by means of a SAR algorithm, or another gain stage and converter, etc., to a digital code $D_{ADC2}$, and $D_{DAC1\_2}$ is combined with $D_{ADC2}$ to generate the final ADC result.

In optional phases of the conversion process, other noise can be filtered, e.g., using a dynamic filter, to reduce a noise bandwidth of the difference signal (generated between the estimated value of the analog input signal and for example, the equivalent voltage on the node $V_{CAP}$ during the conversion process) amplified by amplifier circuit 112. As shown in FIG. 5, the ADC2 circuit 414 can include a dynamic filter that can include a resistive component R1, and a bypass switch 120 to bypass the resistive component R1, as described above with respect to FIGS. 1 and 4.

Ideally, to provide the smallest difference signal, $V_{IN\_ESTIMATE}$ of the analog input signal (or its equivalent) should be very nearly equal to $V_{IN}$ when the switch S5 opens (or ADC2 takes its first sample). A small difference signal allows a higher amplifier gain G and/or a wider bandwidth or dv/dt input signal. In some example configurations, the value of $V_{IN\_ESTIMATE}$ can be the same as the value of $V_{IN}$ when the switch S4 opens. However, the switch S4 opens some time before the switch S5 (or ADC2 samples), during which time $V_{IN}$ may have moved to a new value. It can be desirable to account for the change in $V_{IN}$ over this period. In the example configuration shown in FIGS. 6 and 7 below, a DAC2 circuit has been added to provide a better equivalent value for $V_{IN\_ESTIMATE}$.

The values that DAC2 can be set to can be based on: 1) additional measurements of the input signal and/or its derivative (which may require additional ADCs); 2) previous conversion results from either the final converter result or conversion results from sub-ADCs such as ADC1 or ADC2; or 3) on knowledge of the signal that is being converted. For an oversampled or slow-moving signal, the value of the difference signal ($V_{IN}$−$V_{IN\_ESTIMATE}$) may not change substantially from conversion to conversion. The measured value of the difference signal can then be used to provide an improved value for DAC2 for the next conversion. By using the history from several previous conversions, higher order derivatives can be calculated and used to determine even better predictions for $V_{IN\_ESTIMATE}$.

Figure 6:
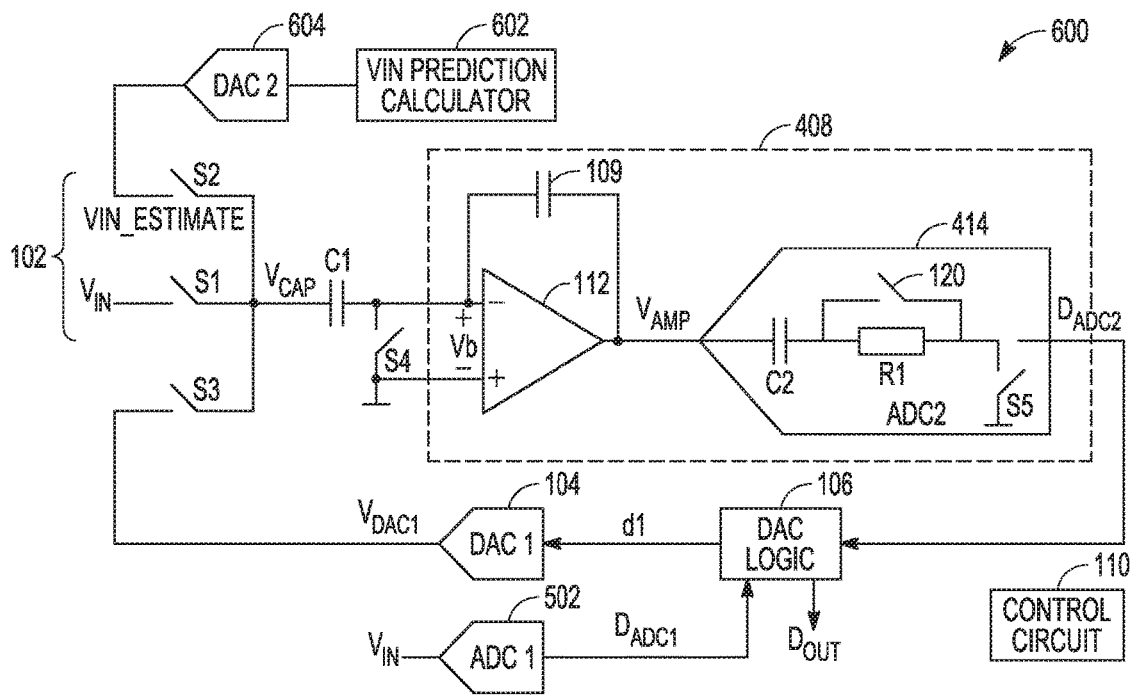
FIG. 6 is a simplified schematic diagram of the ADC circuit 500 of FIG. 5 including an example of a prediction circuit.
Figure 7:
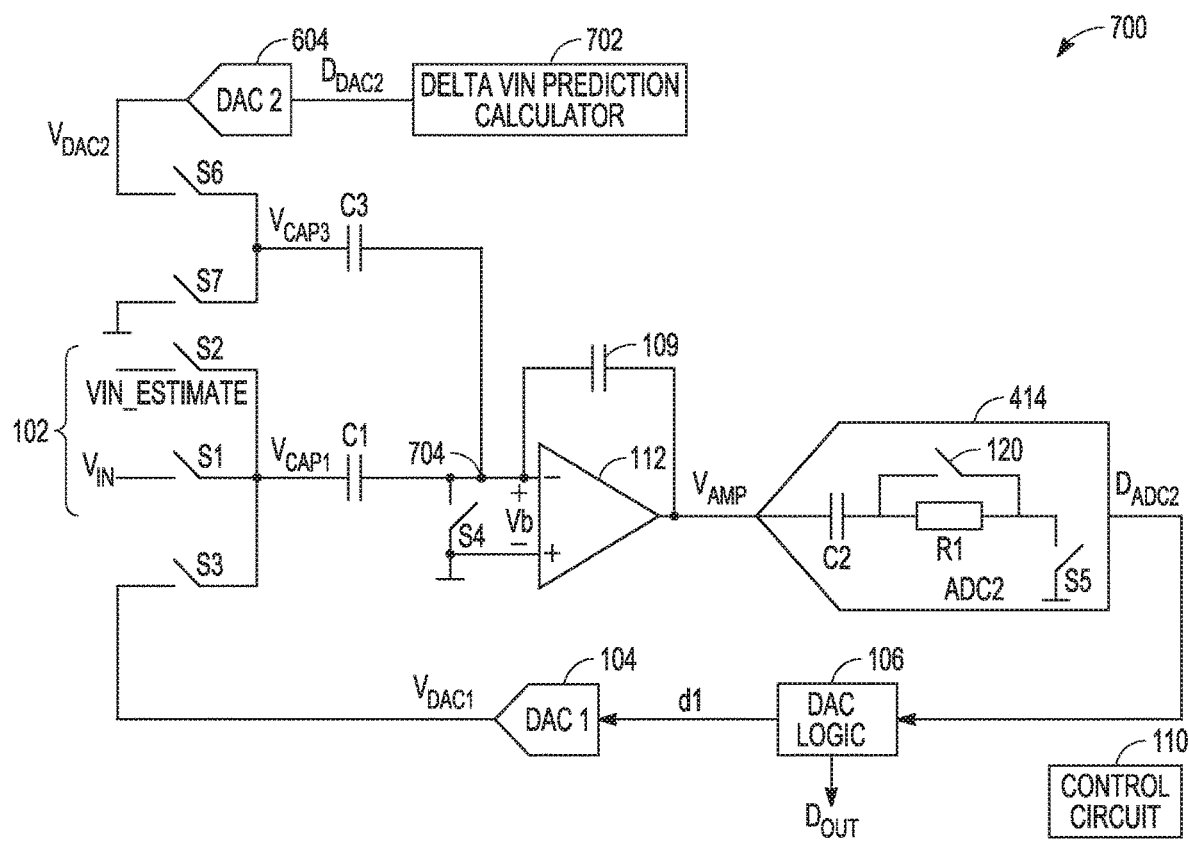
FIG. 7 is a simplified schematic diagram of the ADC circuit 500 of FIG. 5 including another example of a prediction circuit.

It should be noted that although the prediction circuitry is described in FIGS. 6 and 7 with respect to a particular ADC, the prediction circuitry techniques of this disclosure are not limited to this ADC circuit. Rather, the prediction techniques are applicable to each of the ADC circuits described in this disclosure.

FIG. 6 is a simplified schematic diagram of the ADC circuit 500 of FIG. 5 including an example of a prediction circuit. The ADC circuit 600 of FIG. 6 can include components similar to those shown in FIG. 5, with like elements indicated by like reference numerals. In addition, the ADC circuit 600 can include a $V_{IN}$ prediction calculation circuit 602 coupled to a DAC circuit 604 ("DAC2"). The prediction circuitry of FIG. 6 can predict a value of the analog input signal at or close to the sampling instance to provide an improved estimated value of the input signal $V_{IN\_ESTIMATE}$.

In the example shown in FIG. 6, the DAC2 circuit can generate the entire $V_{IN\_ESTIMATE}$ voltage. The $V_{IN\_ESTIMATE}$ value for DAC2 may be derived by linear interpolation from the two previous conversion results. For example, the $V_{IN}$ prediction calculation circuit 602 can determine a slope ($dV_{IN}/dt$) of a line using two previous conversion results.

As mentioned above, higher order derivatives can be determined and used to improve the prediction of the $V_{IN\_ESTIMATE}$ voltage. For example, in some example configurations, the $V_{IN}$ prediction calculation circuit 602 can determine a rate of change of the slope ($d^2V_{IN}/dt^2$) to generate the $V_{IN\_ESTIMATE}$ voltage. In other example configurations, the $V_{IN}$ prediction calculation circuit 602 can determine a value of $d^3V_{IN}/dt^3$, which is the rate at which the rate of change of the slope is changing.

FIG. 7 is a simplified schematic diagram of the ADC circuit 500 of FIG. 5 including another example of a prediction circuit. The ADC circuit 700 of FIG. 6 can include components similar to those shown in FIG. 5, with like elements indicated by like reference numerals.

In addition, the prediction circuitry of the ADC circuit 700 can include a delta $V_{IN}$ prediction calculation circuit 702 coupled to a DAC circuit 604 ("DAC2"). The prediction circuitry of the ADC circuit 700 can further include a capacitor circuit C3 that can be coupled either to the DAC2 circuit via a switch S6 or to a bias voltage or ground via a switch S7. The prediction circuitry of FIG. 7 can predict a value of the analog input signal at or close to the sampling instance to provide an improved estimated value of the input signal $V_{IN\_ESTIMATE}$.

The DAC2 circuit can be used to account for changes in $V_{IN}$ between when $V_{IN\_ESTIMATE}$ is sampled by the switch S4 (e.g., time T2 in Table 2) and when the ADC2 circuit samples the voltage Vamp (e.g., time T4 in Table 2). The voltage of VDAC2 can be calculated using Equation 8:

$$V_{DAC2} = (T4-T2)*dVin/dt, \quad \text{Equation (8)}$$

The delta $V_{IN}$ prediction calculation circuit 702 can determine a slope ($dV_{IN}/dt$) of a line using two previous conversion results.

In some example implementations, the DAC2 circuit can be updated several times between when S4 opens and when the ADC2 circuit takes its first conversion to minimize the magnitude of the signal being processed by the amplifier circuit 112 over this period. In this example implementation $V_{IN\_ESTIMATE}$ can be thought of as a combination of $V_{IN}$ sampled at (T2) and the value $V_{DAC2}$ being provided by DAC2 circuit.

In operation, after opening the switch S4 and prior to opening switch S5, the control circuit 110 opens the switch S6, capturing the charge $V_{DAC2}$ (based on the delta $V_{IN}$ prediction calculator circuit 702) on C3. On closing the switch S7, the voltage change of $V_{DAC2}$ on the node $V_{cap3}$ is transferred to the input of amplifier 112, depending on the capacitor ratio between C3 and C1.

To minimize or eliminate any gain error caused by the amplifier circuit 112, it is desirable that the voltage on the node Vamp is close to zero when S5 opens. The prediction circuitry of FIG. 7 can change the voltage at the input node 704 of the amplifier circuit 112, over a period of time, such that this voltage and hence the the voltage on $V_{AMP}$ are close to zero volts. Using these techniques, when ADC2 samples the difference signal, the value at the input node 704 of the amplifier circuit 112 is close to zero volts.

NOTES

Each of the non-limiting aspects or examples described herein may stand on its own, or may be combined in various permutations or combinations with one or more of the other examples.

The above detailed description includes references to the accompanying drawings, which form a part of the detailed description. The drawings show, by way of illustration, specific embodiments in which the invention may be practiced. These embodiments are also referred to herein as "examples." Such examples may include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In the event of inconsistent usages between this document and any documents so incorporated by reference, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Method examples described herein may be machine or computer-implemented at least in part. Some examples may include a computer-readable medium or machine-readable medium encoded with instructions operable to configure an electronic device to perform methods as described in the above examples. An implementation of such methods may include code, such as microcode, assembly language code, a higher-level language code, or the like. Such code may include computer readable instructions for performing various methods. The code may form portions of computer program products. Further, in an example, the code may be tangibly stored on one or more volatile, non-transitory, or non-volatile tangible computer-readable media, such as during execution or at other times. Examples of these tangible computer-readable media may include, but are not limited to, hard disks, removable magnetic disks, removable optical disks (e.g., compact discs and digital video discs), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other embodiments may be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description as examples or embodiments, with each claim standing on its own as a separate embodiment, and it is contemplated that such embodiments may be combined with each other in various combinations or permutations. The scope of the invention should be determined with reference to the appended claims, along with the full scope of equivalents to which such claims are entitled.

The claimed invention is:

1. A method of operating an analog-to-digital converter (ADC) circuit to convert an analog input signal, the ADC circuit including a first capacitor circuit coupled to both an ADC input and a converter circuit, the method comprising:
    opening a first switch to decouple the first capacitor circuit from a bias voltage while the first capacitor circuit is receiving an estimate of a value of the input signal at or close to a subsequent sampling instance;
    after opening the first switch, opening a second switch in the converter circuit at the sampling instance while the first capacitor circuit is receiving the analog input signal, wherein the opening of the second switch samples a representation of an amplified difference signal, and wherein the difference signal is a difference between the estimate of the value of the analog input signal and the analog input signal;
    generating a digital output using the representation of the amplified difference signal; and
    adjusting the first capacitor circuit based on the digital output.

2. The method of claim 1, further comprising:
    amplifying the difference signal by an amplifier arranged in a negative-feedback configuration.

3. The method of claim 1, further comprising:
    sampling the analog input signal before the sampling instance to provide the estimate of the value of the analog input signal.

4. The method of claim 1, further comprising:
    predicting a value of the analog input signal at or close to the sampling instance to provide the estimate of the value of the analog input signal.

5. The method of claim 4, wherein the prediction uses a derivative of the analog input signal.

6. The method of claim 1, further comprising:
    dynamically reducing noise of the converter circuit.

7. The method of claim 1, wherein the first capacitor circuit includes a capacitor array forming part of a capacitive digital-to-analog converter (DAC) circuit, and wherein receiving the estimate of the value of the analog input signal includes:
    charging at least one capacitor in the first capacitor circuit to a voltage that is responsive to the analog input signal.

8. The method of claim 7, further comprising:
    applying a digital code to the capacitive digital-to-analog converter (DAC) circuit.

9. The method of claim 7, further comprising:
    determining a digital value representative of a combination of the estimated value of the analog input signal and the sampled representation of the amplified difference signal.

10. The method of claim 1, wherein the first capacitor circuit includes a capacitor array forming part of a capacitive digital-to-analog converter (DAC) circuit, and wherein receiving the estimate of the value of the analog input signal includes:
    applying a digital code to the DAC circuit representing the estimate of the value of the analog input signal.

11. The method of claim 1, wherein the first capacitor circuit includes a capacitor array forming part of a capacitive digital-to-analog converter (DAC) circuit, the method further comprising:
    using successive approximation to determine and apply a sequence of at least two digital codes to the capacitive digital-to-analog converter (DAC) circuit.

12. An analog-to-digital converter (ADC) circuit configured to convert a value of an analog input signal, the ADC circuit comprising:
    a first capacitor circuit coupled to both an ADC input and a converter circuit and configured to store an estimate of the value of the analog input signal at a subsequent sampling instance;
    a second capacitor circuit configured to sample an amplified representation of a difference signal, wherein the difference signal is a difference between the estimate of the value of the analog input signal and the analog input signal at the sampling instance;
    the converter circuit including the second capacitor circuit and an amplifier configured to process the difference signal, the converter circuit configured to generate a digital output using the sample stored by the second capacitor circuit; and
    a digital-to-analog converter (DAC) logic circuit configured to adjust the first capacitor circuit based on the digital output.

13. The ADC circuit of claim 12, wherein the converter circuit is configured to generate a further digital output after an adjustment of the first capacitor circuit.

14. The ADC circuit of claim 12, wherein the ADC circuit is configured to generate a digital value representing the value of the analog input signal, and wherein the digital value, at least in part, corresponds to or is determined from one or more converter circuit outputs generated after an adjustment of the first capacitor circuit.

15. The ADC circuit of claim 12, wherein the amplifier is arranged in a negative-feedback configuration.

16. The ADC of claim 12, wherein the converter circuit further comprises:
    a dynamic filter circuit configured to reduce noise of the converter circuit.

17. The ADC circuit of claim 12, wherein the first capacitor circuit includes a capacitor array forming part of a capacitive digital-to-analog converter (DAC) circuit, and wherein at least one capacitor in the first capacitor array is configured to be charged to a voltage that is responsive to the analog input signal.

18. The ADC circuit of claim 17, wherein the DAC circuit is configured to a receive a representation of an output of an ADC sub-circuit that performs a conversion of the analog input signal.

19. An analog-to-digital converter (ADC) circuit configured to convert an analog input signal, the ADC circuit comprising:
- means for storing an estimate of a value of the analog input signal at a subsequent sampling instance, the means for storing coupled to both an ADC input and a means for converting;
- means for sampling a representation of a difference signal, wherein the difference signal is a difference between the estimate of the value of the analog input signal and the analog input signal at the sampling instance;
- the means for converting, including the means for sampling and an amplifier configured to process the difference signal, configured to generate an output using the sample stored by the means for sampling; and
- a digital-to-analog converter (DAC) logic circuit configured to adjust the means for storing based on the output of the means for converting.

20. The ADC circuit of claim 19, further comprising:
- means for predicting a value of the analog input signal at or close to the sampling instance to provide an estimate of the value of the analog input signal.

21. The ADC circuit of claim 12, wherein the ADC circuit is configured to generate a digital value representing the value of the analog input signal, and wherein a resolution of the DAC logic circuit is less than a resolution of the digital value.

22. The ADC circuit of claim 19, wherein the ADC circuit is configured to generate a digital value representing the value of the analog input signal, and wherein a resolution of the DAC logic circuit less than a resolution of the digital value.

* * * * *